United States Patent
Hong et al.

(10) Patent No.: US 11,605,708 B2
(45) Date of Patent: Mar. 14, 2023

(54) INTEGRATED CIRCUIT DEVICES INCLUDING A VERTICAL FIELD-EFFECT TRANSISTOR AND METHODS OF FORMING THE SAME

(71) Applicant: Samsung Electronics Co., Ltd., Suwon-si (KR)

(72) Inventors: Byounghak Hong, Albany, NY (US); Seunghyun Song, Albany, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 71 days.

(21) Appl. No.: 17/094,920

(22) Filed: Nov. 11, 2020

(65) Prior Publication Data
US 2022/0045164 A1    Feb. 10, 2022

Related U.S. Application Data

(60) Provisional application No. 63/062,668, filed on Aug. 7, 2020.

(51) Int. Cl.
| H01L 21/762 | (2006.01) |
| H01L 27/088 | (2006.01) |
| H01L 29/78  | (2006.01) |
| H01L 29/06  | (2006.01) |
| H01L 29/66  | (2006.01) |

(52) U.S. Cl.
CPC .... *H01L 29/0653* (2013.01); *H01L 21/76224* (2013.01); *H01L 27/088* (2013.01); *H01L 29/66666* (2013.01); *H01L 29/7827* (2013.01)

(58) Field of Classification Search
CPC ............ H01L 29/7827; H01L 29/0653; H01L 27/088; H01L 21/823481; H01L 21/823487; H01L 21/823418; H01L 21/76224; H01L 21/823878
See application file for complete search history.

(56) References Cited

U.S. PATENT DOCUMENTS

| 9,412,616 B1 | 8/2016 | Xie et al. |
| 9,589,845 B1 | 3/2017 | Jagannathan et al. |
| 9,627,481 B2 | 4/2017 | Park et al. |
| 9,653,583 B1 | 5/2017 | Zhao et al. |

(Continued)

OTHER PUBLICATIONS

Miyaguchi, K., et al., "Single and Double Diffusion Breaks in 14nm FinFET and Beyond", Extended Abstracts of the 2017 International Conference on Solid State Devices and Materials, Sendai, 2017, 219-220.

*Primary Examiner* — Michael M Trinh
(74) *Attorney, Agent, or Firm* — Myers Bigel, P.A.

(57) ABSTRACT

Integrated circuit devices and methods of forming the same are provided. Integrated circuit devices may include a first active region including a first vertical field effect transistor (VFET), a second active region including a second VFET, and a diffusion break between the first active region and the second active region on a substrate. The diffusion break may include first and second isolation layers in the substrate and a diffusion break channel region protruding from a portion of the substrate. The portion of the substrate may be between the first isolation layer and the second isolation layer. In some embodiments, the first and second isolation layers may be adjacent to respective opposing sidewalls of the diffusion break channel region.

19 Claims, 10 Drawing Sheets

(56) References Cited

U.S. PATENT DOCUMENTS

| | | |
|---|---|---|
| 10,170,480 B2 | 1/2019 | Liaw |
| 10,176,997 B1 * | 1/2019 | De Silva ........... H01L 29/66666 |
| 10,679,994 B1 | 6/2020 | Yang |
| 2012/0037953 A1 * | 2/2012 | Hayano ............... H01L 27/0251 |
| | | 257/133 |
| 2018/0019316 A1 | 1/2018 | Cheng et al. |
| 2018/0122800 A1 * | 5/2018 | Cheng ................ H01L 29/7827 |
| 2018/0233500 A1 * | 8/2018 | Cheng ............. H01L 21/823487 |
| 2019/0051659 A1 * | 2/2019 | Xie ................... H01L 27/11526 |
| 2019/0393220 A1 * | 12/2019 | Na ................. H01L 21/823864 |
| 2020/0273756 A1 * | 8/2020 | Cheng ............. H01L 21/823481 |
| 2020/0312849 A1 * | 10/2020 | Cheng .............. H01L 29/66795 |
| 2020/0373196 A1 * | 11/2020 | Li ..................... H01L 21/76224 |
| 2021/0217871 A1 * | 7/2021 | Li ................... H01L 21/823481 |

\* cited by examiner

INTEGRATED CIRCUIT DEVICES INCLUDING A VERTICAL FIELD-EFFECT TRANSISTOR AND METHODS OF FORMING THE SAME

CROSS-REFERENCE TO RELATED APPLICATION

This application claims priority to U.S. Provisional Application Ser. No. 63/062,668, entitled DIFFUSION BREAK USING VERTICAL FIELD EFFECT TRANSISTOR, filed in the USPTO on Aug. 7, 2020, the disclosure of which is hereby incorporated by reference herein in its entirety.

FIELD

The present disclosure generally relates to the field of electronics and, more particularly, to vertical field-effect transistor (VFET) devices.

BACKGROUND

Various structures and manufacturing processes of VFET devices have been researched because of their high scalability. Therefore, developing manufacturing processes that improve performance and/or reliability of VFET devices may be beneficial.

SUMMARY

According to some embodiments of the inventive concept, integrated circuit devices may include a first active region including a first vertical field effect transistor (VFET), a second active region including a second VFET, and a diffusion break between the first active region and the second active region on a substrate. The diffusion break may include first and second isolation layers in the substrate and a diffusion break channel region protruding from a portion of the substrate. The portion of the substrate may be between the first isolation layer and the second isolation layer. In some embodiments, the first and second isolation layers may be adjacent to respective opposing sidewalls of the diffusion break channel region.

According to some embodiments of the present inventive concept, integrated circuit devices may include a first active region and a second active region that are on a substrate and are spaced apart from each other in a first direction. The first active region may include a first vertical field effect transistor (VFET), and the second active region may include a second VFET. The integrated circuit devices may also include a first isolation layer in the substrate, a dummy channel region on the substrate, and a second isolation layer in the substrate. The first isolation layer, the dummy channel region, and the second isolation layer may be sequentially arranged in the first direction in a plan view.

According to some embodiments of the present inventive concept, integrated circuit devices may include a first active region and a second active region on a substrate. The first active region may include a first channel region protruding from the substrate and a first top source/drain region on the first channel region. The integrated circuit devices may also include a first isolation layer and a second isolation layer in the substrate between the first active region and the second active region, a second channel region protruding from the substrate and being between the first isolation layer and the second isolation layer, and an insulating layer on the second channel region. The insulating layer may contact an entirety of an upper surface of the second channel region.

According to some embodiments of the present inventive concept, methods of forming an integrated circuit device may include forming first, second and third channel regions on a substrate. Each of the first, second and third channel regions may protrude from the substrate, and the first, second and third channel regions may be sequentially arranged in a first direction. The methods may also include forming first and second bottom source/drain regions in the substrate and forming first and second isolation layers in the substrate. The first bottom source/drain region may be between the first and second channel regions in a plan view, and the second bottom source/drain region may be between the second and third channel regions in the plan view. A portion of the first isolation layer may be in the first bottom source/drain region, and a portion of the second isolation layer may be in the second bottom source/drain region. Further, the methods may include forming first and second top source/drain regions on the first and third channel regions, respectively.

DETAILED DESCRIPTION

An integrated circuit device may include a diffusion break to electrically isolate transistors of separate active regions. When a diffusion break includes a single isolation layer having a width greater than a channel pitch, the diffusion break may have a pattern density lower than a pattern density of an active region, and defects caused by the lower pattern density may occur during a fabrication process (e.g., an etch process, a chemical mechanical polishing (CMP) process, or a lithography process). Further, when the diffusion break includes the single isolation layer, the diffusion break may have properties (e.g., a degree of heat adsorption and/or type and extent of stress) different from properties of the active region, and the difference in those properties may make a local layout effect (LLE) complications and may lead to defects.

Figure 1:
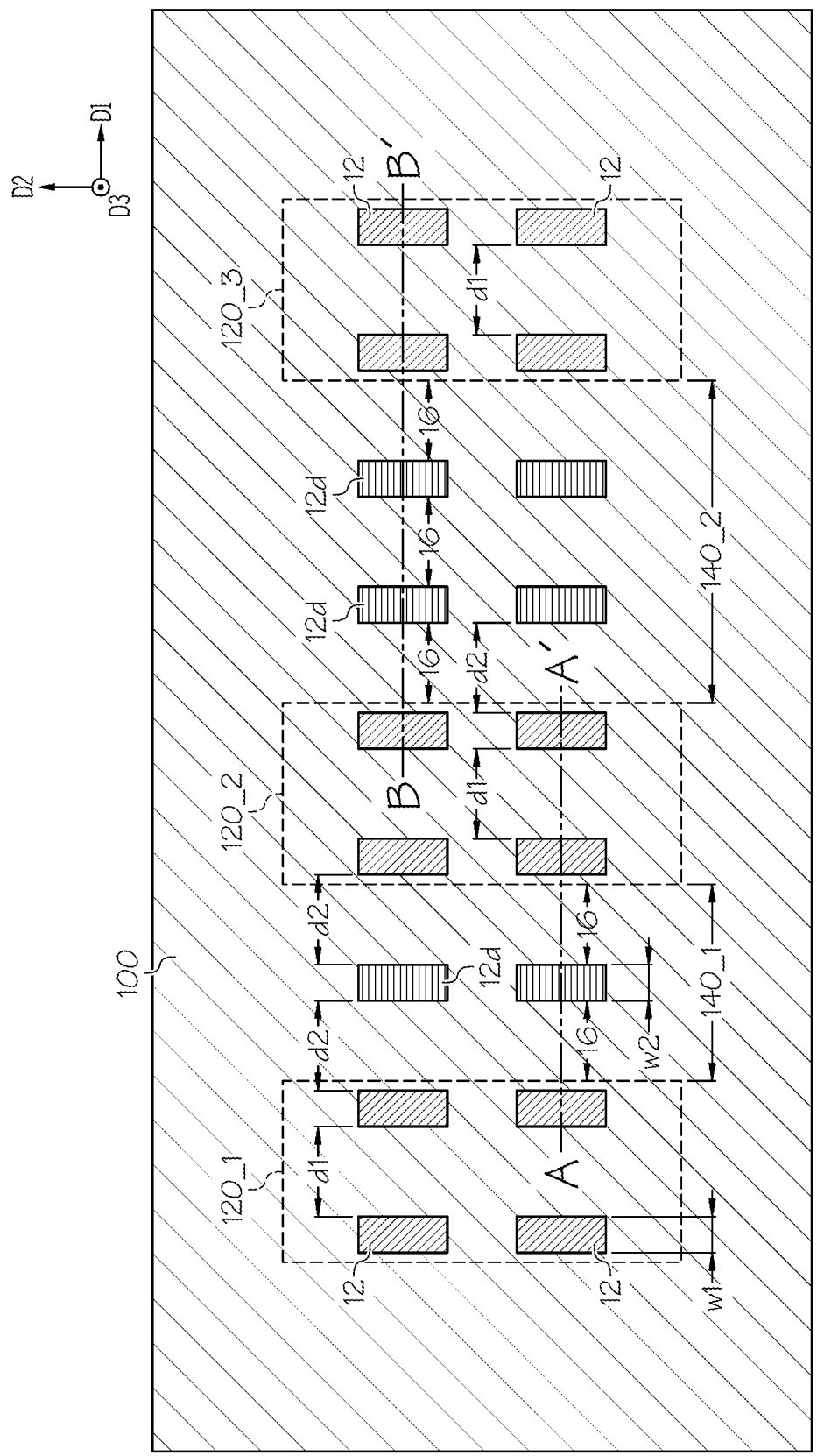
FIG. 1 is a schematic layout of an integrated circuit device according to some embodiments of the inventive concept.
Figure 2:
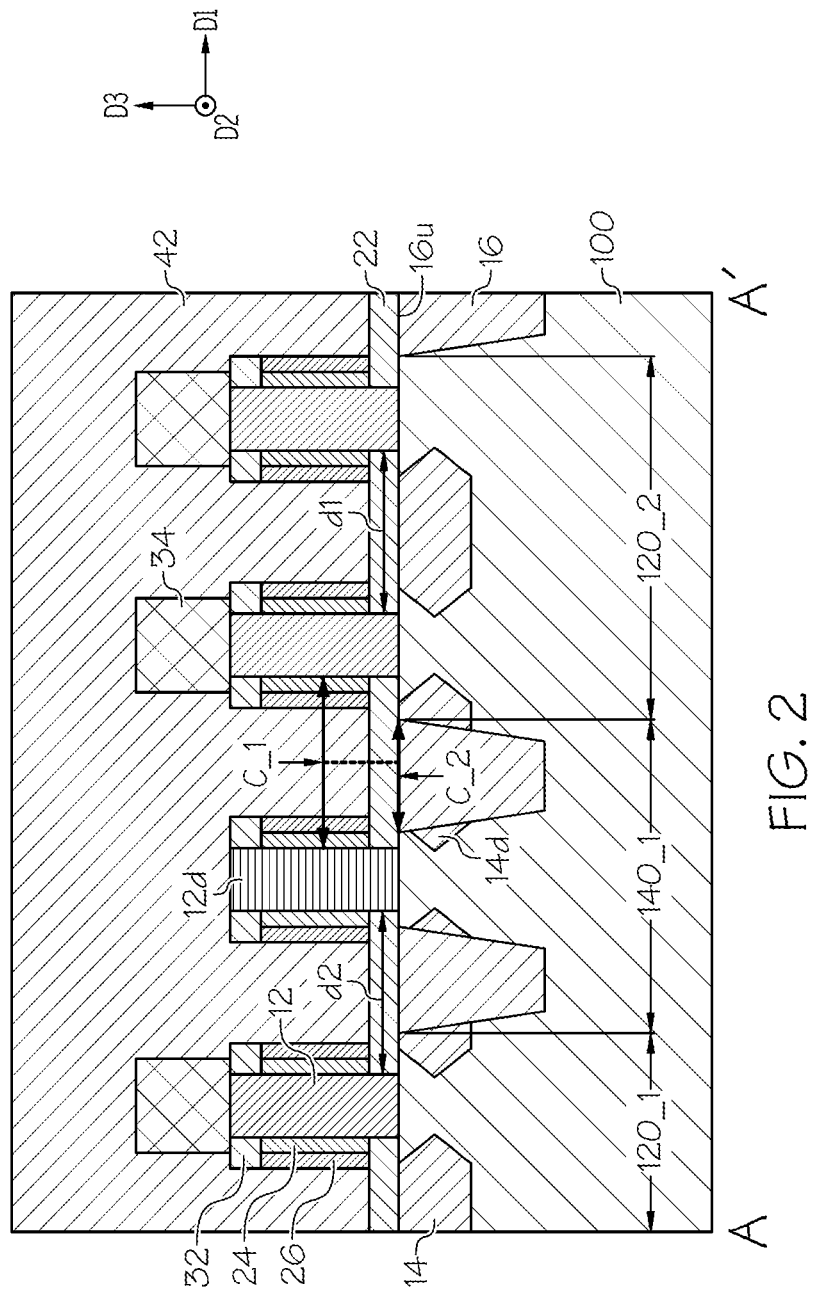
FIGS. 2 and 3 are cross-sectional views of an integrated circuit device taken along the line A-A' of FIG. 1 according to some embodiments of the inventive concept.

FIG. 1 is a schematic layout of an integrated circuit device according to some embodiments of the inventive concept. FIG. 2 is a cross-sectional view of the integrated circuit device taken along the line A-A' of FIG. 1 according to some embodiments of the inventive concept.

Referring to FIGS. 1 and 2, the integrated circuit device may include multiple active regions (e.g., a first active region 120_1, a second active region 120_2, and a third active region 120_3) on a substrate 100. The first active region 120_1, the second active region 120_2, and the third active region 120_3 are spaced apart from each other and are arranged in a first direction D1. Each of the first active region 120_1, the second active region 120_2, and the third active region 120_3 may extend in a second direction D2. As used herein, "an element A extends in a direction X" (or similar language) may mean that the element A extends longitudinally in the direction X.

The first direction D1 and the second direction D2 may be perpendicular to each other. The first direction D1 and the second direction D2 may be, respectively, a first horizontal direction and a second horizontal direction. The substrate 100 may include, for example, one or more semiconductor materials (e.g., Si, Ge, SiGe, GaP, GaAs, SiC, SiGeC and/or InP). In some embodiments, the substrate 100 may be a bulk substrate (e.g., a bulk silicon substrate) or a semiconductor on insulator (SOI) substrate.

In some embodiments, each of the first active region 120_1, the second active region 120_2, and the third active region 120_3 may be a standard cell. The standard cells may be, for example, an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, or a D-flip-flop.

Each of the first active region 120_1, the second active region 120_2, and the third active region 120_3 may include at least one channel region 12 protruding from the substrate 100 in a third direction D3. The third direction D3 may be perpendicular to both the first direction D1 and the second direction D2 and may be a vertical direction. Although FIG. 1 illustrates that each of the first active region 120_1, the second active region 120_2, and the third active region 120_3 includes four channel regions 12 arranged in a specific pattern, the inventive concept is not limited thereto. In some embodiments, each of the first active region 120_1, the second active region 120_2, and the third active region 120_3 may include single channel region 12 or two or more channel regions 12 arranged in a pattern different from the specific pattern illustrated in FIG. 1.

A first diffusion break 140_1 may be provided between the first active region 120_1 and the second active region 120_2 to electrically isolate the first active region 120_1 and the second active region 120_2 from each other. A second diffusion break 140_2 may be provided between the second active region 120_2 and the third active region 120_3 to electrically isolate the second active region 120_2 and the third active region 120_3 from each other.

Each of the first diffusion break 140_1 and the second diffusion break 140_2 may include at least one diffusion break channel region 12d. The first diffusion break 140_1 may include a single diffusion break channel region 12d between the first active region 120_1 and the second active region 120_2 in the first direction D1 as illustrated in FIG. 1 and may be a single diffusion break (SDB). The second diffusion break 140_2 may include two diffusion break channel regions 12d arranged and aligned in the first direction D1 between the second active region 120_2, and the third active region 120_3 in the first direction D1 as illustrated in FIG. 1 and may be a double diffusion break (DDB).

It is noted that the present inventive concept is not limited to the number of the diffusion break channel regions 12d in the first diffusion break 140_1 or the second diffusion break 140_2 illustrated in FIG. 1. In some embodiments, the first diffusion break 140_1 and/or the second diffusion break 140_2 may include more than three diffusion break channel regions 12d arranged and aligned in the first direction D1.

Still referring to FIGS. 1 and 2, the channel region 12 may have a first width w1 in the first direction D1, the diffusion break channel region 12d may have a second width w2 in the first direction D1, and the first width w1 may be equal to the second width w2. For example, the first width w1 may be about 10 nm.

The channel regions 12 on a single active region (e.g., the first active region 120_1) may be spaced apart from each other by a first distance d1 in the first direction D1, the diffusion break channel region 12d and the closest channel region 12 may be spaced apart from each other by a second distance d2 in the first direction D1, and the first distance d1 may be equal to the second distance d2. In some embodiments, upper surfaces of the channel regions 12 may be coplanar with an upper surface of the diffusion break channel region 12d as illustrated in FIG. 1.

Although FIG. 2 illustrates that each of the channel regions 12 and the diffusion break channel region 12d has a vertical sidewall and has a uniform width along the third direction D3, the inventive concept is not limited thereto. In some embodiments, one of the channel regions 12 and the diffusion break channel region 12d may have a slanted sidewall and may have a varying width along the third direction D3. When one of the channel regions 12 and the diffusion break channel region 12d has a slanted sidewall, the first width w1 and/or the second width w2 may be a width of a lower surface of the channel region 12 or the diffusion break channel region 12d. The lower surface of the channel region 12 or the diffusion break channel region 12d may contact the substrate 100. Further, the first distance d1 and the second distance d2 may be measured with reference to the lower surface of the channel region 12 and/or the lower surface of the diffusion break channel region 12d.

Referring to FIG. 2, a gate dielectric layer 24 and a gate electrode layer 26 may be provided on a sidewall of each of the channel regions 12 and the diffusion break channel region 12d. A bottom source/drain region 14 may be provided in the substrate 100 adjacent a lower surface of each of the channel regions 12, and a top source/drain region 34 may be provided on an upper surface of each of the channel regions 12. The top source/drain region 34 may contact the upper surface of the channel region 12. Each bottom source/drain region 14 and each top source/drain region 34 may include an impurity element (e.g., B, Al, Ga, P and/or As). The channel region 12, the bottom source/drain region 14, the top source/drain region 34, the gate dielectric layer 24, and the gate electrode layer 26 may constitute a VFET.

The gate dielectric layer 24 may include, for example, silicon oxide and/or a high-k material (e.g., hafnium oxide or aluminum oxide). The gate electrode layer 26 may include a conductive layer including, for example, metal (e.g., W, Ti, Cu, and/or Co) or doped semiconductor material. The gate electrode layer 26 may include multiple layers sequentially stacked on the gate dielectric layer 24 and may include a work function layer and a conductive layer. The work function layer may include, for example, metal nitride (e.g., TiN, TiAlN, TaAlN), TiAl, TaC, TiC, or HfSi.

A lower spacer layer 22 may be provided between the bottom source/drain region 14 and the gate electrode layer 26 for electrical isolation therebetween. An upper spacer layer 32 may be provided between the gate electrode layer 26 and the top source/drain region 34 for electrical isolation therebetween. Each of the lower spacer layer 22 and the upper spacer layer 32 may include an insulating material, for example, SiN and/or SiON.

The first diffusion break 140_1 may include two isolation layers 16 in the substrate 100 adjacent opposing sidewalls of the diffusion break channel region 12d, respectively. The isolation layer 16 may include an insulating material, such as silicon oxide. A first isolation layer 16 of the two isolation layers 16 may contact a sidewall of the first active region 120_1, and a second isolation layer 16 of the two isolation layers 16 may contact a sidewall of the second active region 120_2.

A diffusion break bottom source/drain region 14d may be provided in the substrate 100 adjacent a sidewall of the diffusion break channel region 12d. The diffusion break bottom source/drain region 14d may include an impurity element that is the same as the impurity element of the bottom source/drain regions 14. A size of the diffusion break bottom source/drain region 14d may not be large enough to function as a source/drain region of a transistor, and the diffusion break bottom source/drain region 14d may be a dummy bottom source/drain region. The isolation layer 16 may contact a sidewall of the diffusion break bottom source/drain region 14d. In some embodiments, the diffusion break bottom source/drain region 14d may be omitted.

As illustrated in FIG. 2, the diffusion break channel region 12d and the closest channel region 12 may define a gap therebetween, and the gap has a first center C_1 in the first direction D1. The upper surface 16u has a second center C_2 in the first direction D1, and the first center C_1 may be offset toward the closest channel region 12 from the second center C_2 in the first direction D1.

In some embodiments, a top source/drain region may not be provided on the diffusion break channel region 12d, as illustrated in FIG. 2. An insulating layer 42 provided on the top source/drain regions 34 may contact an entirety of an upper surface of the diffusion break channel region 12d. As a top source/drain region is not provided on the diffusion break channel region 12d, a current does not flow through the diffusion break channel region 12d when the gate electrode layer 26 on the diffusion break channel region 12d is biased. Accordingly, the diffusion break channel region 12d may be a dummy channel region.

Figure 3:
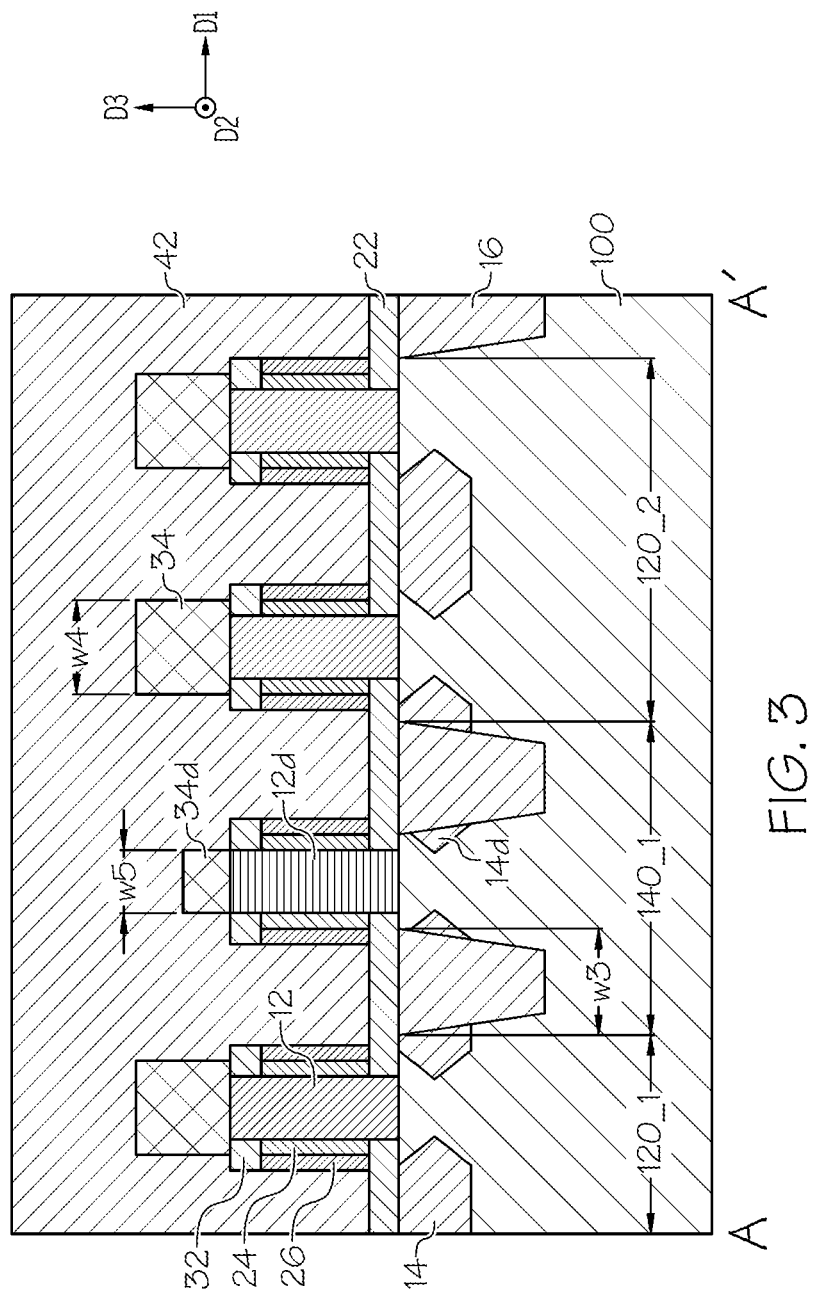

FIG. 3 is a cross-sectional view of an integrated circuit device taken along the line A-A' of FIG. 1 according to some embodiments of the inventive concept. Referring to FIG. 3, a diffusion break top source/drain region 34d may be provided on the diffusion break channel region 12d. The diffusion break top source/drain region 34d may be much smaller than the top source/drain region 34. For example, the top source/drain region 34 may have a fourth width w4 in the first direction D1, the diffusion break top source/drain region 34d may have a fifth width w5 in the first direction D1, and the fifth width w5 may be at most 0.8 times the fourth width w4. In some embodiments, the fifth width w5 may be less than 0.5 times the fourth width w4.

A size of the diffusion break top source/drain region 34d may not be large enough to function as a top source/drain region of a transistor, and the diffusion break top source/drain region 34d may be a dummy top source/drain region. A small size of the diffusion break top source/drain region 34d may help to maintain electrical isolation between the diffusion break top source/drain region 34d and an adjacent top source/drain 34 and thus may reduce the possibility of defects caused by electrical short between the diffusion break top source/drain region 34d and the adjacent top source/drain 34.

The isolation layer 16 may include an upper surface 16u that may have a third width w3 in the first direction D1 that may be narrower than the second distance d2 shown in FIG. 2 between the diffusion break channel region 12d and the closest channel region 12 in the first direction D1. For example, the third width w3 may be about 21 nm.

Figure 4:
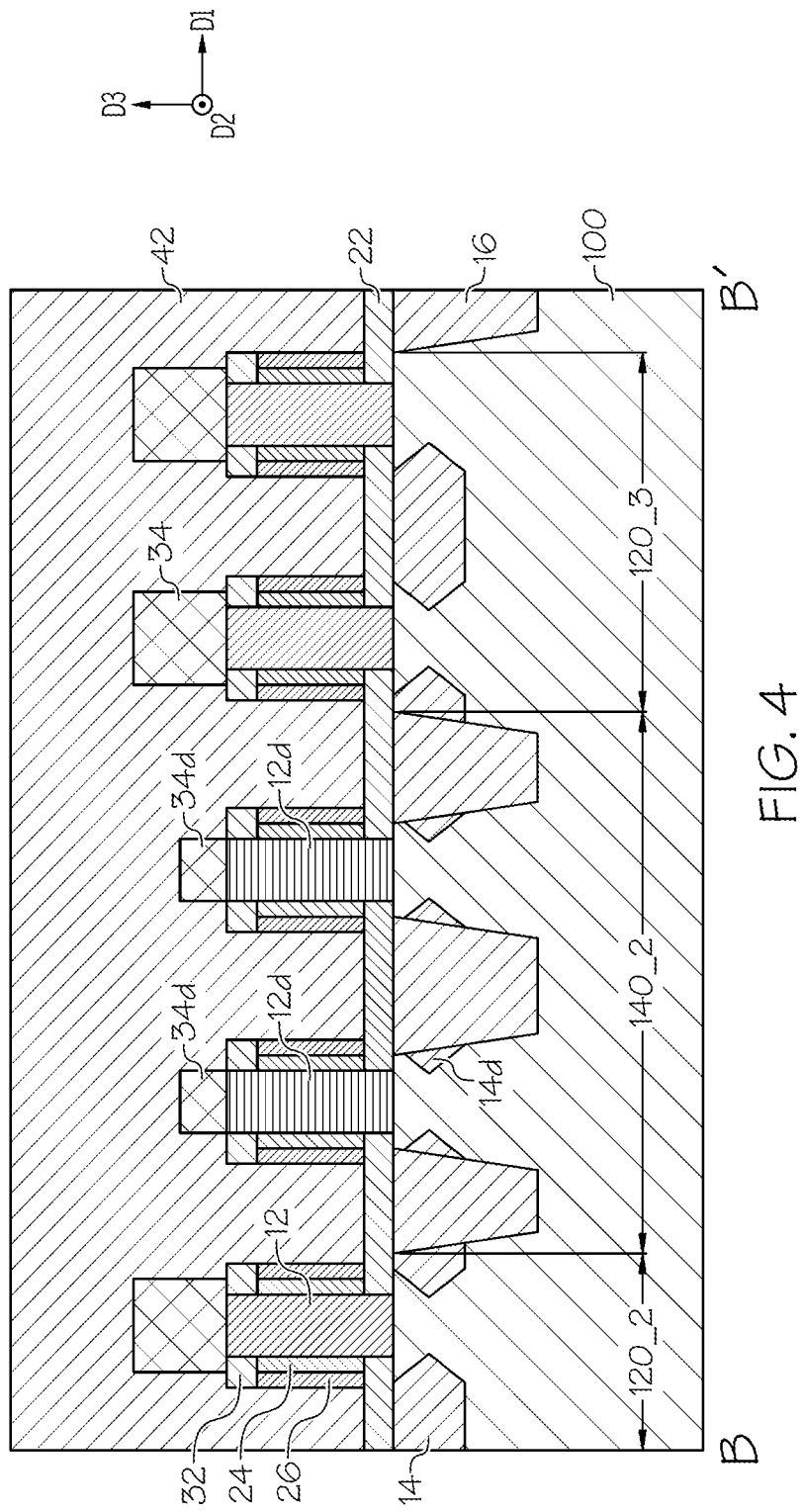
FIGS. 4 and 5 are cross-sectional views of an integrated circuit device taken along the line B-B' of FIG. 1 according to some embodiments of the inventive concept.

FIG. 4 is a cross-sectional view of an integrated circuit device taken along the line B-B' of FIG. 1 according to some embodiments of the inventive concept. FIG. 4 bears some similarity to FIGS. 2 and 3, and similar components are labeled with similar reference numbers. Referring to FIG. 4, the second diffusion break 140_2 may include two diffusion break channel regions 12d that protrude from the substrate 100 and are arranged and aligned in the first direction D1. Referring to FIGS. 1 and 4, the two diffusion break channel regions 12d may be between two isolation layers 16. Further, an additional isolation layer 16 may be provided between the two diffusion break channel regions 12d.

Although FIG. 4 illustrates that diffusion break top source/drain regions 34d are provided on the two diffusion break channel regions 12d, in some embodiments, the diffusion break top source/drain regions 34d may be omitted, and the insulating layer 42 may contact an entirety of an upper surface of each of the two diffusion break channel regions 12d. Further, although FIG. 4 illustrates that the second diffusion break 140_2 includes diffusion break bottom source/drain regions 14d, in some embodiments, the diffusion break bottom source/drain regions 14d may be omitted.

Figure 5:
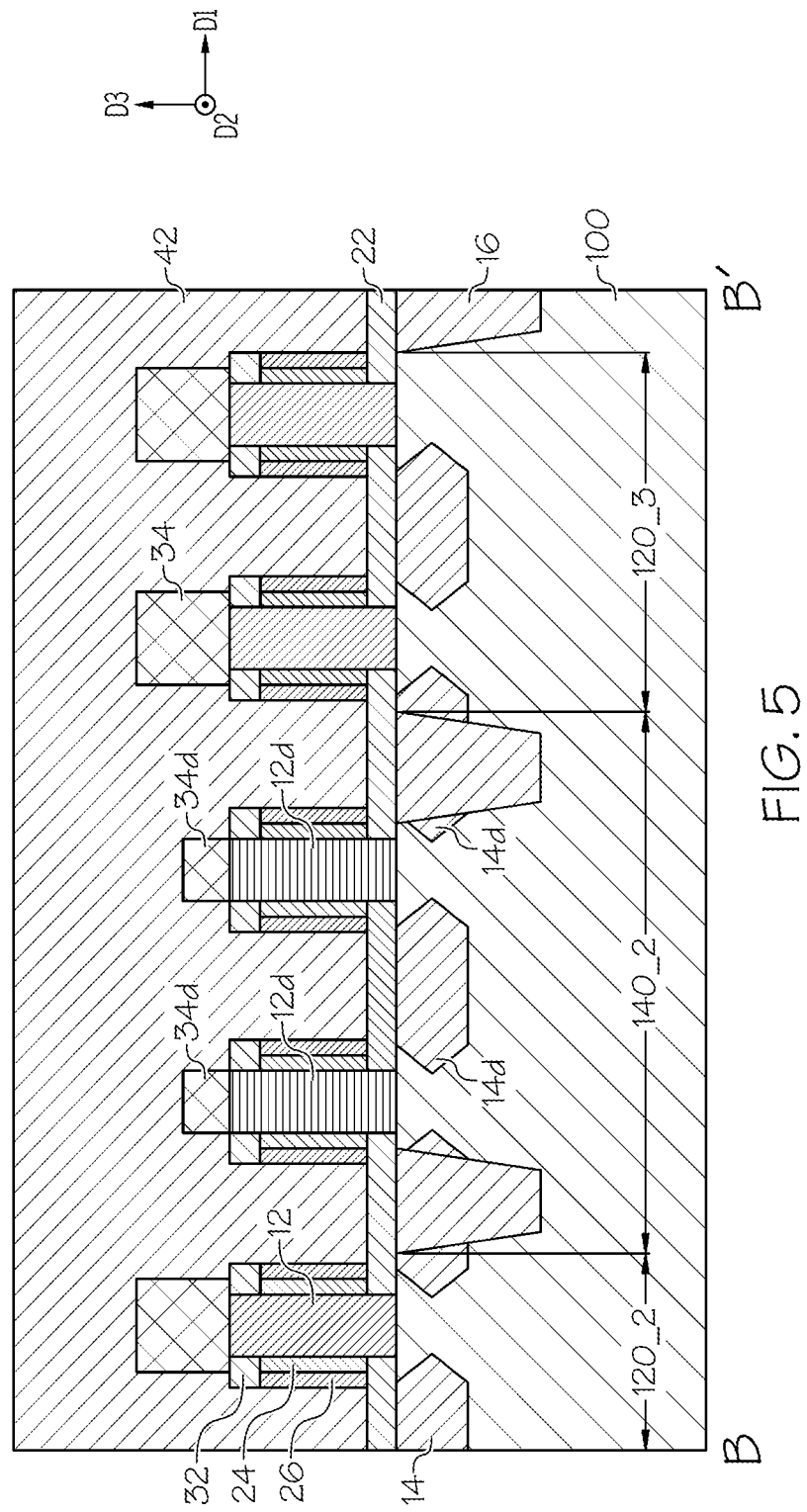

FIG. 5 is a cross-sectional view of an integrated circuit device taken along the line B-B' of FIG. 1 according to some embodiments of the inventive concept. FIG. 5 bears some similarity to FIGS. 2, 3, and 4, and similar components are labeled with similar reference numbers. Referring to FIG. 5, an isolation layer 16 may not be provided in the substrate 100 between the two diffusion break channel regions 12d, and a single diffusion break bottom source/drain region 14d may be provided in the substrate 100 between the two diffusion break channel regions 12d.

Figure 6:
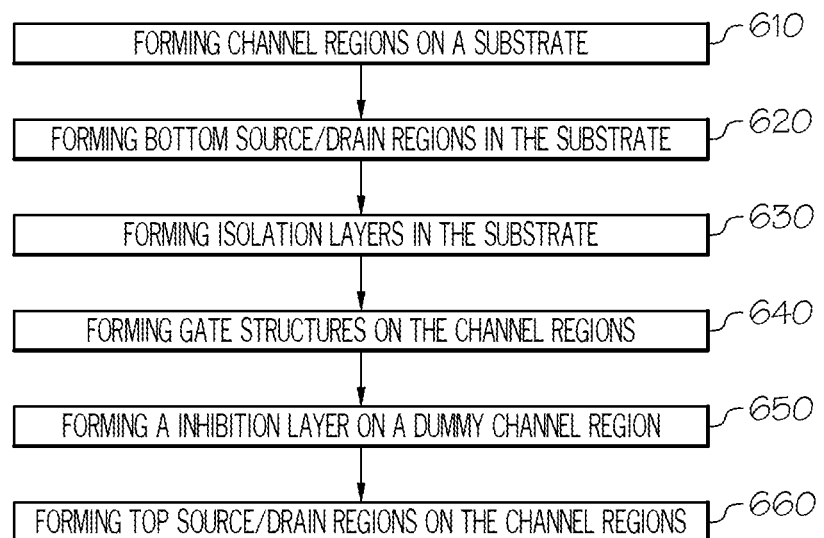
FIG. 6 is a flow chart of methods of forming an integrated circuit device according to some embodiments of the inventive concept.

FIG. 6 is a flow chart of methods of forming an integrated circuit device according to some embodiments of the inventive concept. FIGS. 7 through 10 are cross-sectional views, taken along the line A-A' of FIG. 1, illustrating a method of forming an integrated circuit device according to some embodiments of the inventive concept.

Figure 7:
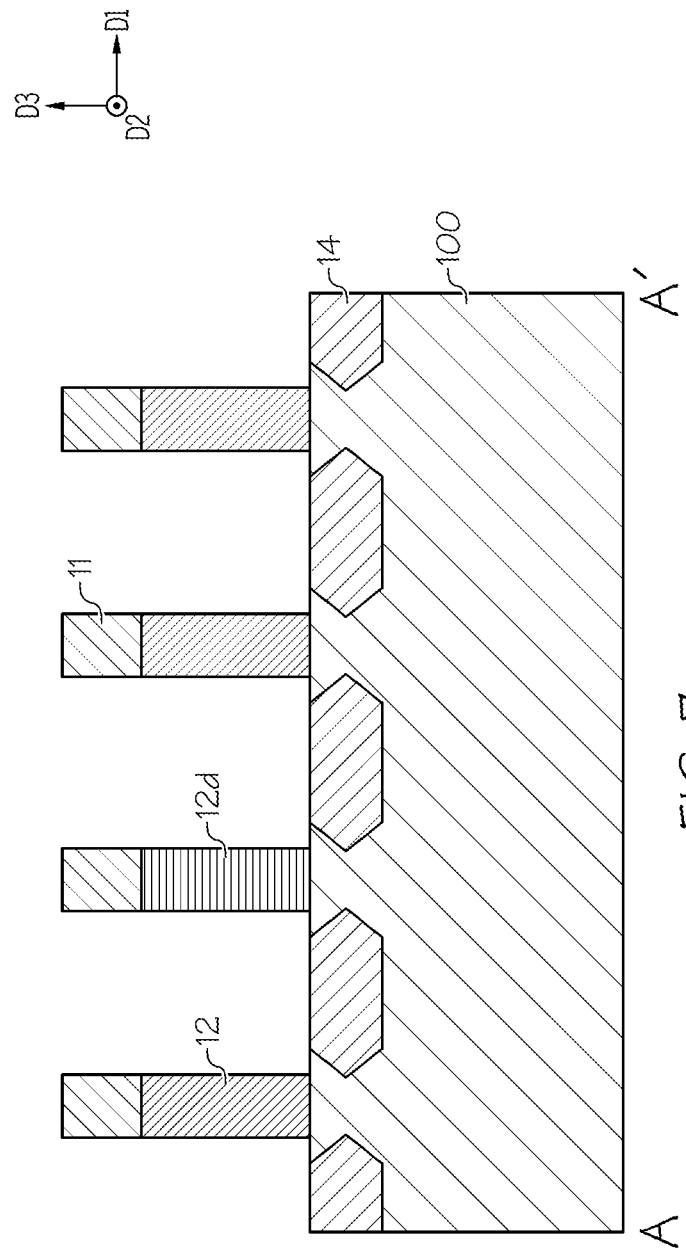
FIGS. 7 through 10 are cross-sectional views, taken along the line A-A' of FIG. 1, illustrating a method of forming an integrated circuit device according to some embodiments of the inventive concept.

Referring to FIGS. 6 and 7, the methods may include forming channel regions (e.g., channel regions 12 and a diffusion break channel region 12d) on a substrate 100 (Block 610). For example, the channel regions may be formed by etching the substrate 100 using channel mask layers 11 as an etch mask. The channel mask layers 11 may include, for example, a photo resist material, a hard mask material, and/or a silicon layer including nitrogen and/or oxygen. Although FIG. 7 illustrates the channel mask layer 11 is a single layer, in some embodiments, the channel mask layer 11 may include multiple layers sequentially stacked in the third direction D3.

Bottom source/drain regions 14 may be formed in the substrate 100 (Block 620). The bottom source/drain regions 14 may be formed by adding an impurity element into portions of the substrate 100 using, for example, an ion implantation process.

Figure 8:
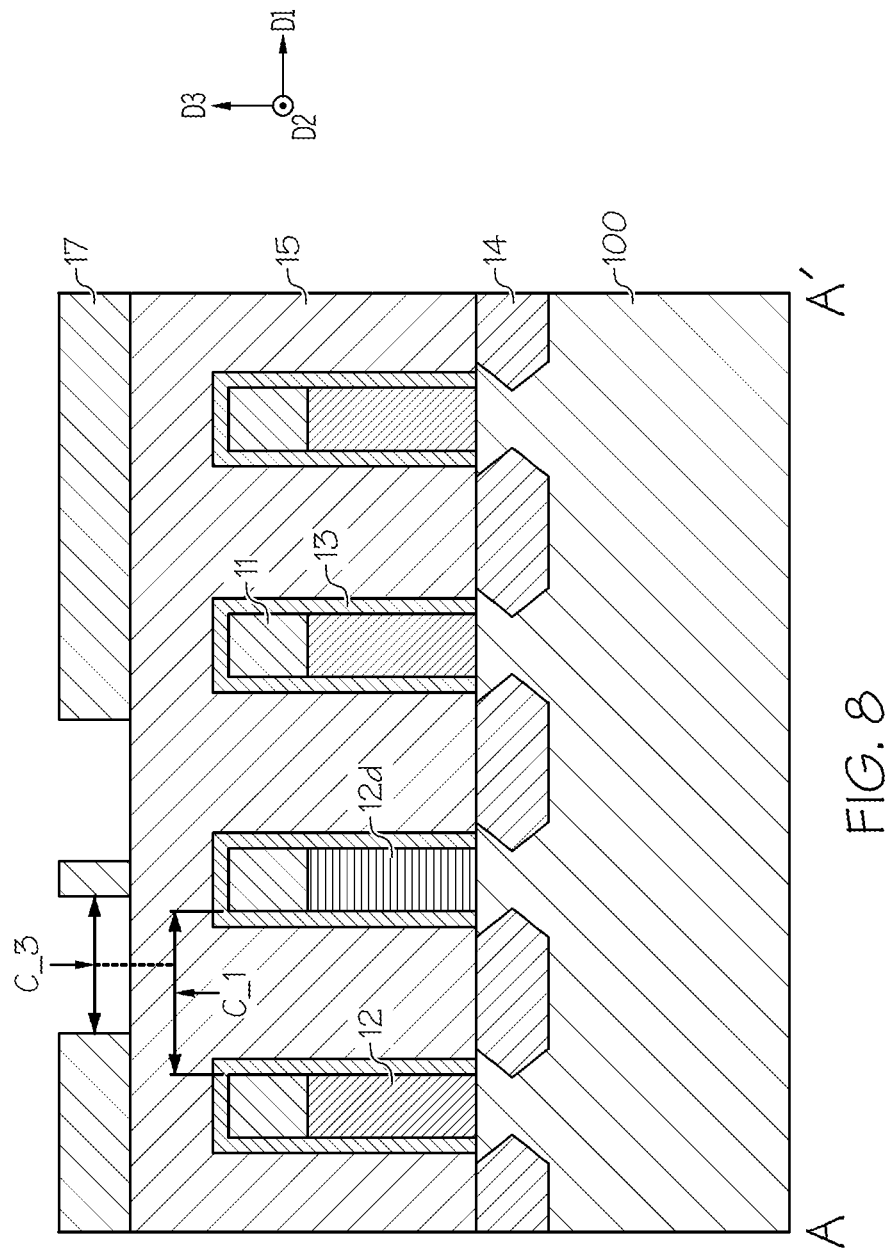

Referring FIG. 8, a liner layer 13, a first mask layer 15, and a second mask layer 17 may be sequentially formed on the channel regions 12 and the diffusion break channel region 12d. In some embodiments, the liner layer 13 may be formed conformally on the channel regions 12 and the diffusion break channel region 12d and may have a uniform thickness on the channel regions 12 and the diffusion break channel region 12d. Each of the liner layer 13, the first mask layer 15, and the second mask layer 17 may include a material having an etch selectivity with respect to the substrate 100. Each of the liner layer 13, the first mask layer 15, and the second mask layer 17 may include, for example, a photo resist material, a hard mask material, and/or a silicon layer including nitrogen and/or oxygen.

Figure 9:
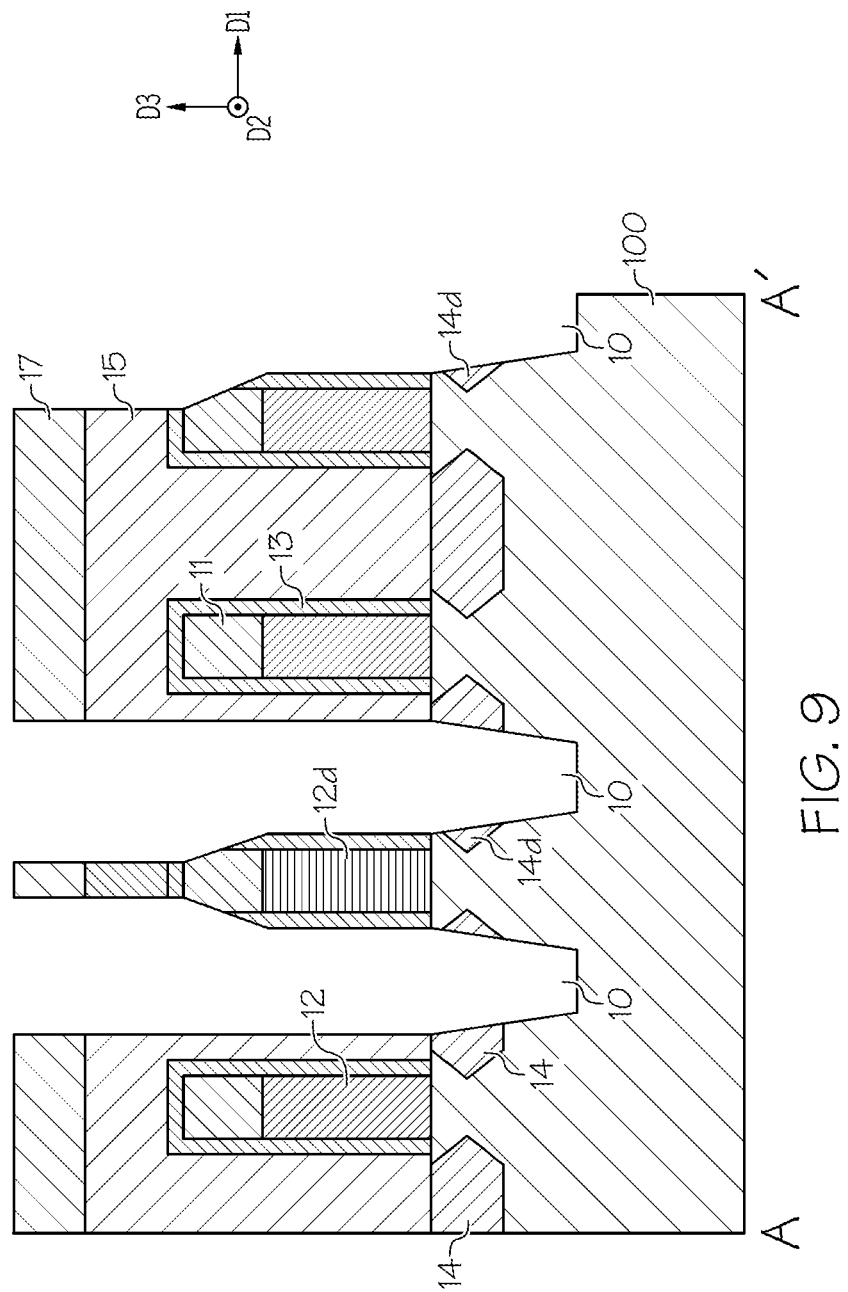

An opening of the second mask layer 17 may have a third center C_3 in the first direction D1 that may be offset toward the diffusion break channel region 12d from the first center C_1 such that, after forming a trench (e.g., a trench 10 in FIG. 9), a remaining portion of the bottom source/drain regions 14 adjacent the channel region 12 may be bigger than a diffusion break bottom source/drain region (e.g., a diffusion break bottom source/drain region 14d in FIG. 9).

Referring to FIG. 9, trenches 10 may be formed in the substrate 100 by etching the substrate 100 using the liner layer 13, the first mask layer 15, and the second mask layer 17 as an etch mask. The trenches 10 may be formed by etching the first mask layer 15 using the second mask layer 17 as an etch mask and then etching the substrate 100. In some embodiments, the liner layer 13 on opposing sidewalls of the diffusion break channel region 12d may be exposed while etching the first mask layer 15 as illustrated in FIG. 9.

Figure 10:
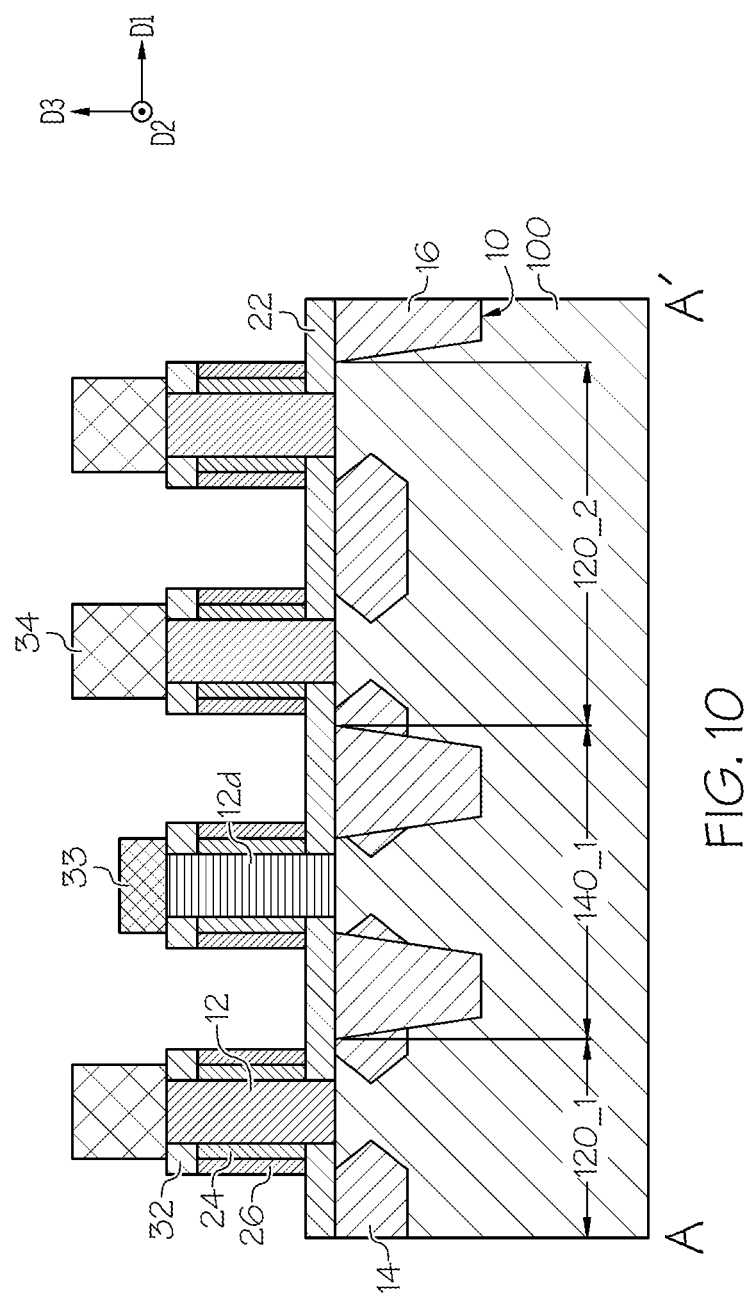

Referring to FIGS. 6 and 10, isolation layers 16 may be formed in the trenches 10, respectively (Block 630). The channel mask layer 11, the liner layer 13, the first mask layer 15, and the second mask layer 17 of FIG. 9 may be removed to expose upper surfaces of the channel regions 12 and the diffusion break channel region 12d. A lower spacer layer 22 may be formed on the substrate 100, and then a gate structure including a gate dielectric layer 24 and a gate electrode layer 26 may be formed on a side of each of the channel regions 12 and the diffusion break channel region 12d (Block 640). An upper spacer layer 32 may be formed on the gate structures.

An inhibition layer 33 may be formed on the diffusion break channel region 12d (Block 650). The inhibition layer 33 may cover an entirety of an upper surface of the diffusion break channel region 12d as illustrated in FIG. 10. The inhibition layer 33 may include nitride and/or oxide and may inhibit formation of a top source/drain region on the diffusion break channel region 12d.

Top source/drain regions 34 may be formed on the channel regions 12 (Block 660) by, for example, an epitaxial growth process using the channel regions 12 as a seed layer. As the inhibition layer 33 covers the diffusion break channel region 12d, an epitaxial layer may not be grown on the diffusion break channel region 12d, as illustrated in FIG. 2, or a small epitaxial layer may be formed on the diffusion break channel region 12d, as illustrated in FIG. 3.

The second diffusion break 140_2 illustrated in FIGS. 4 and 5 may be formed by changing a number and widths of openings of the second mask layer 17 illustrated in FIG. 8.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that references herein to "an element A vertically overlapping an element B" (or similar language) means that a vertical line intersecting both the elements A and B exists. It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
a first active region and a second active region on a substrate, the first active region comprising a first vertical field effect transistor (VFET) and the second active region comprising a second VFET, wherein the first VFET comprises a first channel region protruding from the substrate and a first top source/drain region on the first channel region;
a diffusion break between the first active region and the second active region,
wherein the diffusion break comprises:
a first isolation layer and a second isolation layer in the substrate; and
a diffusion break channel region protruding from a portion of the substrate, wherein the portion of the substrate is between the first isolation layer and the second isolation layer,
wherein an upper surface of the diffusion break channel region is devoid of a top source/drain region, and
the diffusion break channel region comprises a semiconductor material.

2. The integrated circuit device of claim 1,
wherein the integrated circuit device further comprises an insulating layer on the diffusion break channel region, and the insulating layer contacts an entirety of the upper surface of the diffusion break channel region.

3. The integrated circuit device of claim 1, wherein the first VFET comprises two first VFETs that comprise the first channel region and a second channel region, respectively, and
the first and second channel regions are spaced apart from each other by a first distance, and the first channel region and the diffusion break channel region are spaced apart from each other by a second distance that is equal to the first distance.

4. The integrated circuit device of claim 3, wherein upper surfaces of the first and second channel regions are coplanar with the upper surface of the diffusion break channel region.

5. The integrated circuit device of claim 1, wherein the first isolation layer contacts at least a portion of a sidewall of the first active region.

6. The integrated circuit device of claim 1, wherein
the first isolation layer comprises an upper surface having a width that is not greater than a distance between the first channel region and the diffusion break channel region.

7. The integrated circuit device of claim 1, wherein the first isolation layer contacts at least a portion of a sidewall of the first active region, and
the first channel region and the diffusion break channel region define a first gap therebetween, and a first center of the first gap is offset toward the first channel region from a second center of an upper surface of the first isolation layer.

8. The integrated circuit device of claim 1, wherein
the first channel region and the diffusion break channel region have an equal width.

9. The integrated circuit device of claim 1, wherein the diffusion break channel region comprises a first diffusion break channel region and a second diffusion break channel region that protrude from the substrate, and
the first and second diffusion break channel regions are between the first isolation layer and the second isolation layer in a plan view.

10. The integrated circuit device of claim 9, further comprising a third isolation layer that is between the first and second diffusion break channel regions in the plan view.

11. The integrated circuit device of claim 1, further comprising a first bottom source/drain region in the first active region, and a diffusion break bottom source/drain region in the portion of the substrate,
wherein opposing sidewalls of the first isolation layer contact the first bottom source/drain region and the diffusion break bottom source/drain region, respectively, and
the first bottom source/drain region is bigger than the diffusion break bottom source/drain region.

12. The integrated circuit device of claim 1, wherein the first isolation layer contacts at least a portion of a sidewall of the first active region, and the second isolation layer contacts at least a portion of a sidewall of the second active region, and
the first isolation layer and the second isolation layer are spaced apart from the diffusion break channel region.

13. An integrated circuit device comprising:
a first active region and a second active region that are on a substrate and are spaced apart from each other in a first direction, the first active region comprising a first vertical field effect transistor (VFET) and the second active region comprising a second VFET;
a dummy region that is on the substrate between the first and second active regions;
a first isolation layer that is in the substrate between the first active region and the dummy region;
a dummy channel region protruding from the dummy region; and
a second isolation layer that is in the substrate between the second active region and the dummy region,
wherein the first VFET comprises a first channel region protruding from the first active region, and opposing sidewalls of the first isolation layer contact a sidewall of the first active region and a sidewall of the dummy region, respectively,
the dummy channel region comprises a semiconductor material, and
the first channel region and the dummy channel region define a first gap therebetween, and a first center of the first gap is offset toward the first channel region from a second center of an upper surface of the first isolation layer.

14. The integrated circuit device of claim 13, wherein the first VFET further comprises a first top source/drain region that is on the first channel region and has a first width in the first direction, and
the integrated circuit device further comprises a dummy top source/drain region that is on the dummy channel region and has a second width in the first direction, and the second width is at most 0.8 times the first width.

15. The integrated circuit device of claim 13, wherein the first VFET comprises two first VFETs that comprise the first channel region and a second channel region, respectively, and
the first and second channel regions are spaced apart from each other by a first distance, and the first channel region and the dummy channel region are spaced apart from each other by a second distance that is equal to the first distance.

16. The integrated circuit device of claim 13, wherein
the upper surface of the first isolation layer has a width that is not greater than a distance between the first channel region and the dummy channel region.

17. The integrated circuit device of claim 13, wherein the second isolation layer contacts a sidewall of the second active region.

18. The integrated circuit device of claim 13, further comprising a first bottom source/drain region in the first active region, and a dummy bottom source/drain region in the dummy region, wherein the opposing sidewalls of the first isolation layer contact the first bottom source/drain region and the dummy bottom source/drain region, respectively, and the first bottom source/drain region is bigger than the dummy bottom source/drain region.

19. The integrated circuit device of claim 13, wherein the first isolation layer and the second isolation layer are spaced apart from the dummy channel region.

\* \* \* \* \*